(12) United States Patent
Walker

(10) Patent No.: US 6,960,916 B2
(45) Date of Patent: Nov. 1, 2005

(54) CIRCUIT BREAKER OVERCURRENT AND GROUND FAULT TEST APPARATUS

(76) Inventor: Michael L. Walker, 1242 Summer La., Auburn, GA (US) 30011

( * ) Notice: Subject to any disclaimer, the term of this patent is extended or adjusted under 35 U.S.C. 154(b) by 0 days.

(21) Appl. No.: 10/722,320

(22) Filed: Nov. 25, 2003

(65) Prior Publication Data

US 2005/0110501 A1 May 26, 2005

(51) Int. Cl.$^7$ ............................................. G01R 31/327
(52) U.S. Cl. ....................................... 324/509; 324/424
(58) Field of Search .......................... 324/424, 66, 508, 324/550, 536, 509, 512, 522–523, 527–528; 361/42

(56) References Cited

U.S. PATENT DOCUMENTS

| 2,976,484 | A | * | 3/1961 | McClain ...................... 324/508 |
| 3,852,660 | A | | 12/1974 | Maier |
| 3,898,557 | A | | 8/1975 | Strock |
| 3,952,244 | A | * | 4/1976 | Spear ......................... 324/508 |
| 4,114,092 | A | | 9/1978 | Fry |
| 4,947,278 | A | | 8/1990 | Nichols |
| 4,949,214 | A | | 8/1990 | Spencer |
| 5,351,038 | A | | 9/1994 | Goldberg |
| 5,736,861 | A | | 4/1998 | Keleher |
| 5,812,352 | A | | 9/1998 | Rokita |
| 6,218,844 | B1 | * | 4/2001 | Wong et al. ................. 324/509 |
| 6,731,483 | B2 | * | 5/2004 | Mason et al. ................. 361/42 |
| 6,850,073 | B2 | * | 2/2005 | Elms et al. ................. 324/509 |
| 2002/0057089 | A1 | * | 5/2002 | Brown ....................... 324/508 |
| 2003/0090271 | A1 | | 5/2003 | Hurwicz |
| 2003/0107854 | A1 | * | 6/2003 | Mason et al. ................. 361/42 |

* cited by examiner

Primary Examiner—Anjan Deb
Assistant Examiner—M. Kramskaya
(74) Attorney, Agent, or Firm—Powell Goldstein LLP; Jason A. Bernstein; Charles L. Warner, II

(57) ABSTRACT

An electrical circuit test apparatus for testing a three-conductor electrical circuit outlet connected to an associated circuit breaker. The three-conductor connections are the electrically active (Hot), neutral and ground. Any suitable color-coding either national or international may, if desired, be used to identify the electrically active (Hot), neutral and ground electrical conductors. A three-conductor electrical cable is connected at one end to a three-prong plug. The other end of the electrical cable is connected to the electrical test apparatus that determines and indicates the current energized state of the circuit breaker.

5 Claims, 1 Drawing Sheet

CIRCUIT BREAKER OVERCURRENT AND GROUND FAULT TEST APPARATUS

FIELD OF THE INVENTION

The present invention relates, in general, to an electrical test apparatus. In particular, the present invention relates to a method and apparatus for testing ground fault/arcfault operation and/or disengaging an electrical circuit breaker.

BACKGROUND OF THE INVENTION

Historically, finding and testing electrical circuit breakers installed in a home or commercial buildings has been a laborious task. The central difficulty in finding and testing electrical circuit breakers is the electrical outlet is generally remotely positioned or spaced to its associated electrical circuit breaker. Finding and testing electrical circuit breakers that are greatly spaced apart and at times on separate elevations is typically a multi-person task or a one person task requiring extensive time to execute finding and testing the electrical circuit breakers. Typically, one person would be located at the electrical outlet with some type of test indicator inserted into the outlet. A second person would be stationed at the service panel containing all of the electrical circuit breakers. The second person would disengage one electrical circuit breaker at a time and then ask the first person via any convenient communications means if the test indicator became active. For example, if the test indicator was on it would turn off. If the test indicator was off it would turn on. This process would continue until disengaging a selected electrical circuit breaker would produce the expected results.

Attempts in the past to circumvent the laborious task of finding and testing electrical circuit breakers, as discussed above, involved electrically short-circuiting the electrical outlet. This type of test can be destructive if the electrical breaker is of a sufficient amperage rating to heat and melt the electrical short-circuit as well as the electrical outlet. Further, if an electrical ground fault/arcfault is to be tested the test method discussed above is insufficient.

It would be desirable to have a non-destructive test to find and test electrical circuit breakers. The finding and testing electrical circuit breakers should only require one person to implement. The test apparatus and method would allow indication of the electrical outlet activity i.e., whether or not the outlet was active or energized. The test apparatus would be able to remotely test and disengage an electrical circuit breaker from its electrical circuit outlet.

SUMMARY OF THE INVENTION

The first embodiment of the present invention is an electrical circuit test apparatus for testing a three-conductor electrical circuit outlet's connectivity to its associated circuit breaker. The three-conductor electrical circuit is generally named as the electrical active (Hot), neutral and ground conductors. The first embodiment of the present invention is contained in the housing. A three-conductor electrical cable is connected at one end. A three-prong plug and the other end of electrical cable are connected to the electrical components of the first embodiment of the present invention via the housing. The top portion of the housing has at least one light emitting device and an actuator switch mounted thereon.

The electrical plug is inserted into an electrical outlet connected to its associated electrical circuit breaker. The light-emitting device illuminates connoting the presence of electrical power at the electrical outlet. The actuator switch is engaged momentarily causing a non-destructive electrical short-circuit across the electrical circuit breaker. The electrical circuit breaker, responding to the excess electrical current passing through it, disengages causing the electrical current flowing there through to stop. The light emitting device sensing the stoppage of electrical current extinguishes thereby indicating the electrical circuit connecting the electrical outlet and the electrical circuit breaker may, if desired, be safely handled without suffering electrical shock.

The second embodiment of the present invention may, if desired, be positioned in the housing the same way as disclosed above. One end of the housing has an opening allowing access to the interior of the housing by the three-conductor electrical cable. The three-conductor electrical cable is connected at one end to a three-prong plug and the other end of electrical cable is connected to the electrical components of the second embodiment of the present invention via the opening in housing. The top portion of the housing has at least one light-emitting device mounted thereon. A selected actuator switch is mounted onto the housing. The light emitting device and the selected actuator switch are electrically interconnected to the three-conductor electrical cable to enable testing the electrical circuit breaker and the electrical ground fault/arcfault indicator.

When taken in conjunction with the accompanying drawings and the appended claim, features and advantages of the present invention become apparent upon reading the following detailed description of the embodiments of the invention.

BRIEF DESCRIPTION OF THE DRAWINGS

The invention is illustrated in the drawings in which like reference characters designate the same or similar parts throughout the figures of which.

DETAILED DESCRIPTION OF THE INVENTION

Figure 1:
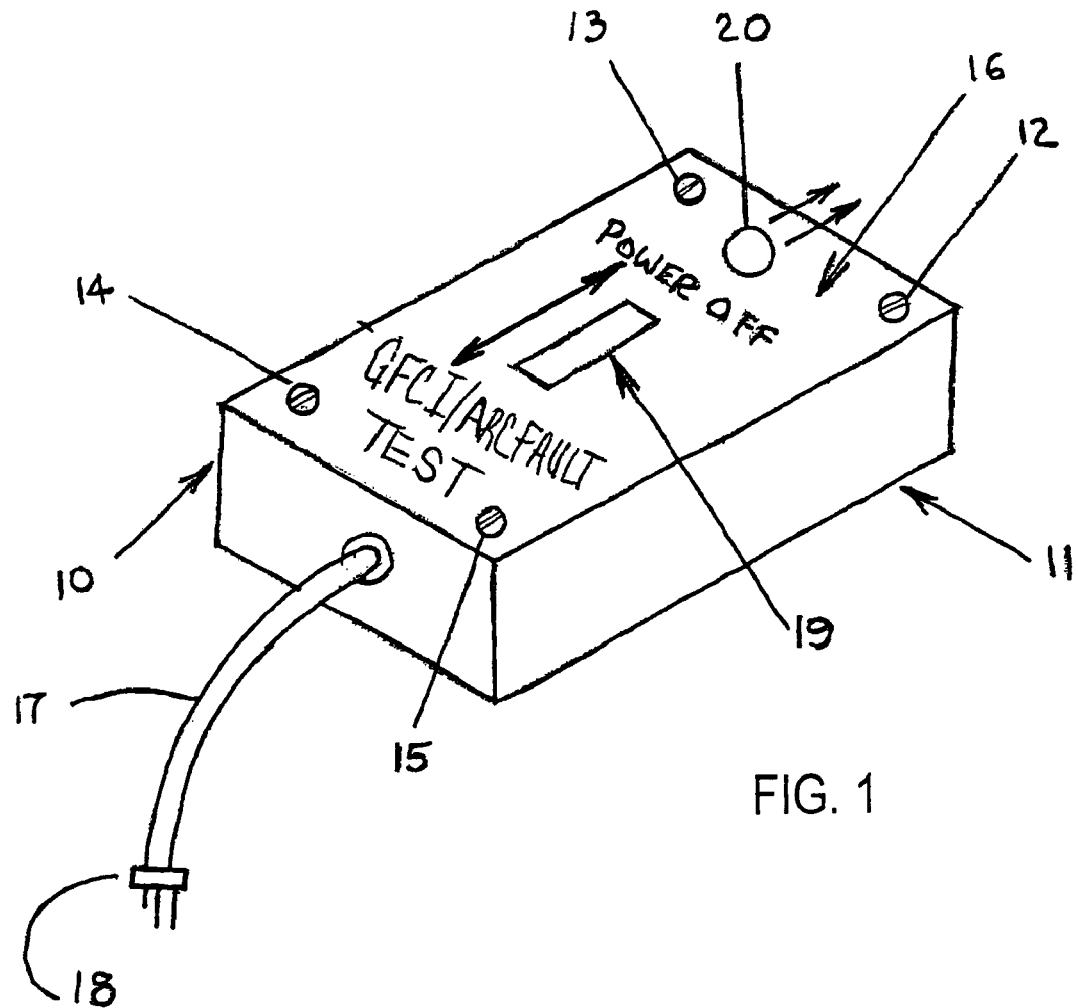
FIG. 1 illustrates a top-level schematic view diagram of the housing containing the present invention.

Before describing in detail the particular improved apparatus for testing electrical circuits in accordance with the present invention, it should be observed that the invention resides primarily in a novel structural combination of conventional electrical signal, power transfer components, associated communication circuits, the command and control of the aforementioned components and circuits and not in the particular detailed configuration thereof. Accordingly, the structure, command, control, and arrangement of these conventional components and circuits have, for the most part, been illustrated in the drawings by readily understandable diagrams. The drawings show only those specific details that are pertinent to the present invention in order not to obscure the disclosure with structural details which will be readily apparent to those skilled in the art having the benefit of the description herein. For example, a typical housing 11 for the first and second embodiments of the present invention 10 is illustrated in FIG. 1 as being substantially rectangular i.e., the housing has two long sides adjoined to two perpendicularly mounted short sides. The short and long sides of the housing 11 have a perimeter edge connected to the bottom portion of the housing 11 along its perimeter edge. The long-sides, short-sides and bottom portion of the housing 11 form walls enclosing an interior portion or cavity of the housing 11. A top portion 16 may, if desired, be used to cover the interior portion of the housing 11. Various portions forming the housing 11 have been simplified in order to emphasize those portions that are most pertinent to the invention. Thus, the diagram illustrations of the Figures do not necessarily represent the mechanical structural arrangement of the exemplary system, but are primarily intended to illustrate major hardware structural components of the system in a convenient functional grouping whereby the first and second embodiments of the present invention may be more readily understood.

An overview of the first embodiment of the present invention: The first embodiment of the present invention 10, FIG. 1 is an electrical circuit test apparatus for testing electrical circuit outlet connectivity to its associated circuit breaker. Any convenient electrical outlet may, if desired, be used in conjunction with the first embodiment of the present invention 10. An example of a convenient electrical circuit outlet is the three-conductor outlet found in private homes and businesses and used as a vehicle to provide a connection receptacle for devices requiring electrical power to operate. The three-conductor connections are the electrically active (hot), neutral and ground conductors. Any suitable color-coding corresponding to either national or international electrical codes may, if desired, be used to identify the electrically active (hot), neutral and ground electrical conductors.

The first embodiment of the present invention 10 is contained in housing 11, FIG. 1. A three-conductor electrical cable 17 is connected at one end to a three-prong plug 18 and the other end of electrical cable 17 is connected to the electrical components of the first embodiment of the present invention 10 via the housing 11. The top portion 16 of housing 11 has at least one light emitting Diode 20 and an actuator switch 19 mounted thereon.

In operation, the electrical plug 18 is inserted into an electrical outlet connected to its associated electrical circuit breaker. The light emitting Diode 20 illuminates connoting the presence of electrical power at the electrical outlet. The actuator switch 19 is engaged momentarily causing a short circuit across the circuit breaker. The circuit breaker, responding to the excess electrical current passing through it, disengages causing the electrical current flowing therethrough to stop. The light-emitting device 20, sensing the stoppage of electrical current, extinguishes thereby indicating the electrical circuit connecting the electrical outlet and the circuit breaker may, if desired, be safely handled without suffering electrical shock.

A more detailed discussion of the first embodiment of the present invention: The first embodiment of the present invention 10 may, if desired, be housed in any convenient enclosure of any convenient geometrical shape. The enclosure may, if desired, be fire resistant and explosion resistant as required by local or national safety codes. The enclosure may, if desired, be fabricated from a plurality of any materials or a combination of material. Examples of materials are metal, plastic or polymer based material. The shape of the enclosure may, if desired, be round, square, rectangular, oval or any other geometric shape.

An exemplary first embodiment of the present invention's 10 enclosure is housing 11, FIG. 1. Housing 11 is substantially rectangular i.e., the housing has two long sides adjoined to two perpendicularly mounted short sides. The short and long sides of the housing 11 have a perimeter edge connected to the bottom portion of the housing 11 along the perimeter edge. The long-sides, short-sides and bottom portion of the housing 11 form walls enclosing an interior portion or cavity of the housing 11. A top portion 16 may, if desired, be used to cover the interior portion of the housing 11. The top portion 16 is secured to the bottom portion of housing 11 by four screws 12, 13, 14 and 15.

Figure 2:
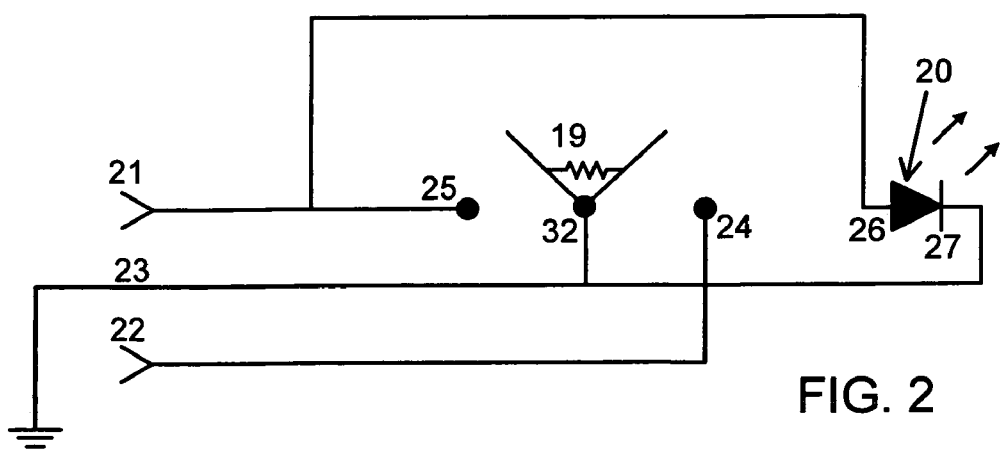
FIG. 2 illustrates a top-level electrical schematic view diagram of an embodiment of the present invention.

One end of the housing 11 has an opening allowing access to the interior of the housing 11 by the three-conductor electrical cable 17. The three-conductor electrical cable 17 is connected at one end to a three-prong plug 18 and the other end of electrical cable 17 is connected to the electrical components of the first embodiment of the present invention 10 via the opening in housing 11. The top portion 16 of housing 11 has at least one light emitting device 20 mounted thereon. An actuator switch 19 may, if desired, be any convenient double pole single throw switch that has a momentary contact capability. Examples of suitable double pole single throw switches that have momentary contact capability are a push-button switch and a spring-loaded toggle switch. The actuator switch 19 is mounted onto housing 11 by any convenient means. The light emitting Diode 20 is mounted onto the housing 11 in any convenient position. An exemplary light emitting Diode 20, FIG. 1 is a light emitting diode having and anode 26 and cathode 27. One pole 25, FIG. 2 of the actuator switch 19 is connected to the anode 26 of the light emitting device 20 and to the electrical active or "hot" conductor 21. The other pole 24 is connected to the electrical neutral conductor 22. The cathode 27 of the light emitting device 20 is connected to the ground electrical conductor 23.

In operation of an embodiment of the present invention 10, the three-prong plug 18 is inserted into an electrical outlet. The light emitting device 20 illuminates indicating the presence of electrical current passing through the associated electrical circuit breaker and the light emitting device 20. The actuator switch 19 is engaged and momentarily short circuits the electrical circuit breaker by connecting poles 25 and 32, thereby causing the circuit breaker to become disengaged or "tripping" thereby preventing the flow of electrical current to the light emitting device 20. The light emitting device 20 extinguishes indicating the electrical circuit containing the circuit breaker and the electrical outlet are safe to have maintenance performed thereon, handled or worked on.

The actuator switch 19 has a second position that when engaged momentarily connects poles 24 and 32 causing the light emitting Diode 20 to extinguish indicating the ground fault/arcfault function is operating. After the actuator switch 19 momentarily connects poles 24 and 32 the actuator switch 19 returns to the center off position.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claim, means-plus-function clause is intended to cover the structures described herein as performing the recited function and not only structural equivalents but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

I claim:

1. An apparatus for testing a circuit breaker having an overcurrent interrupt capability and a ground fault interrupt capability, the circuit breaker providing electrical power to a three conductor electrical circuit outlet wherein the three conductors are electrically active, neutral and ground, the apparatus comprising:
   a) a double pole normally open switch having a first pole connected to the electrically active conductor, a second pole connected to the neutral conductor, and a common pole connected to the ground conductor, and having a first position wherein the first pole is momentarily in electrical contact with the common pole, and having a second position wherein the second pole is momentarily in electrical contact with the common pole;
   b) a light emitting diode having an anode and cathode, said anode being electrically connected to the electrically active conductor and the first pole of said normally open switch, said cathode being electrically connected to the ground conductor and the common pole of said normally open switch;
   c) when said switch is operated in the first position said switch causes the electrically active conductor to be momentarily short-circuited to the ground conductor, thereby causing said overcurrent interrupt capability of said circuit breaker to cause said circuit breaker to open and said light emitting diode to cease emitting light; and
   d) when said switch is operated in the second position said switch causes the neutral conductor to be momentarily short-circuited to the ground conductor, thereby causing said ground fault interrupt capability of said circuit breaker to cause said circuit breaker to open and said light emitting diode to cease emitting light.

2. An apparatus as recited in claim 1 further comprising a substantially rectangular housing containing the apparatus.

3. An apparatus as recited in claim 1 wherein said double pole normally open switch is a spring-loaded toggle switch.

4. An apparatus for electrical circuit testing comprising:
   a) a substantially rectangular housing;
   b) a three conductor electrical cord disposed on one end of said substantially rectangular housing, said three conductor electrical cord having an electrically active conductor, a neutral conductor and a ground conductor;
   c) a normally open double pole momentary switch mounted onto said substantially rectangular housing, said switch having a first pole connected to the electrically active conductor, a second pole connected to the neutral conductor, and a common pole connected to the ground conductor, and having a first position wherein the first pole is momentarily in electrical contact with the common pole, and having a second position wherein the second pole is momentarily in electrical contact with the common pole;
   d) a light emitting diode having an anode and a cathode, said anode being electrically connected to the electrically active conductor and the first pole of said normally open switch, said cathode being electrically connected to said ground conductor and the common pole of said normally open switch, said light emitting diode emitting visible light when electrical power is present between said electrically active conductor and said electrical ground conductor connections;
   e) when said switch is operated in the first position said switch causes the electrically active conductor to be momentarily short-circuited to the ground conductor; and
   f) when said switch is operated in the second position said switch causes the neutral conductor to be momentarily short-circuited to the ground conductor.

5. A method for testing a three conductor electrical circuit outlet connectively disposed to an associated electrical circuit breaker to determine and indicate the current energized state of the circuit breaker, said circuit breaker having an overcurrent interrupt capability and a ground fault interrupt capability, said three conductor electrical circuit outlet having an electrically active conductor, a neutral conductor, and a ground conductor, the method comprising the steps of:
   a) providing an electrical circuit test apparatus having a three prong connector, a momentary-operation actuator switch and a light emitting device operationally disposed therein, said actuator switch being operable in a first position to momentarily short-circuit said electrically active conductor to said ground conductor, or operable in a second position to momentarily short-circuit said neutral conduct to said ground conductor, said light emitting diode indicating the presence of electrical power between said electrically active conductor and said ground conducting when emitting light;
   b) inserting said three prong connector into the electrical circuit outlet thereby causing said light emitting device to illuminate if said circuit breaker is providing electrical power to said outlet; and
   c) engaging said actuator switch to at least one of said first position and said second position, thereby causing at least one of said overcurrent interrupt capability or said ground fault interrupt capability of said circuit breaker to open said circuit breaker, thereby causing said light emitting device to extinguish indicating the associated electrical circuit breaker has been disengaged.

* * * * *